United States Patent [19]

Garza

[11] Patent Number: 5,595,861
[45] Date of Patent: *Jan. 21, 1997

[54] METHOD OF SELECTING AND APPLYING A TOP ANTIREFLECTIVE COATING OF A PARTIALLY FLUORINATED COMPOUND

[75] Inventor: Mario Garza, Sunnyvale, Calif.

[73] Assignee: LSI Logic Corporation, Milpitas, Calif.

[*] Notice: The term of this patent shall not extend beyond the expiration date of Pat. No. 5,330,883.

[21] Appl. No.: 461,119

[22] Filed: Jun. 5, 1995

Related U.S. Application Data

[62] Division of Ser. No. 189,574, Jan. 31, 1994, which is a division of Ser. No. 907,757, Jun. 29, 1992, Pat. No. 5,330,883.

[51] Int. Cl.$^6$ ................................. G03C 1/825
[52] U.S. Cl. .................... 430/510; 430/155; 430/273.1; 430/512
[58] Field of Search .................... 430/510, 512, 430/155, 273, 273.1

[56] References Cited

U.S. PATENT DOCUMENTS

| | | | |
|---|---|---|---|
| 4,169,187 | 9/1979 | Glazar | 428/418 |
| 4,201,586 | 5/1980 | Hori et al. | 430/541 |
| 4,282,118 | 8/1981 | Hwang | 430/69 |
| 4,290,384 | 9/1981 | Ausschnitt et al. | 118/722 |
| 4,402,128 | 9/1983 | Blackstone | 29/591 |
| 4,506,434 | 3/1985 | Ogawa et al. | 29/571 |
| 4,541,169 | 9/1985 | Bartush | 29/591 |
| 4,665,007 | 5/1987 | Cservak et al. | 430/311 |
| 4,672,023 | 6/1987 | Leung | 430/311 |
| 4,698,128 | 10/1987 | Berglund et al. | 156/643 |
| 4,710,254 | 12/1987 | Garlick | 428/409 |
| 4,762,396 | 8/1988 | Dumant et al. | 350/320 |
| 4,873,176 | 10/1989 | Fisher | 430/313 |
| 4,906,852 | 3/1990 | Nakata et al. | 250/548 |
| 4,912,022 | 3/1990 | Urguhart et al. | 430/396 |
| 4,929,992 | 5/1990 | Thomas et al. | 357/23.9 |
| 4,977,330 | 12/1990 | Batchelder et al. | 250/560 |
| 4,992,260 | 2/1991 | Caslavsky et al. | 424/52 |
| 5,001,040 | 3/1991 | Blakeney et al. | 430/326 |
| 5,002,851 | 3/1991 | Toukhy | 430/192 |
| 5,008,156 | 4/1991 | Hong | 430/5 |
| 5,055,871 | 10/1991 | Pasch | 355/53 |
| 5,063,138 | 11/1991 | Salamy | 430/326 |
| 5,066,561 | 11/1991 | Pampalone | 430/169 |
| 5,075,257 | 12/1991 | Hawk et al. | 437/225 |
| 5,128,230 | 7/1992 | Templeton et al. | 430/191 |
| 5,168,001 | 12/1992 | Legare et al. | 428/194 |
| 5,177,172 | 1/1993 | Toukhy | 528/153 |
| 5,178,955 | 1/1993 | Aharoni et al. | 428/421 |
| 5,178,986 | 1/1993 | Zampini et al. | 430/190 |
| 5,178,989 | 1/1993 | Heller et al. | 430/323 |
| 5,266,455 | 11/1993 | Jones | 430/536 |
| 5,330,883 | 7/1994 | Garza | 430/513 |
| 5,380,622 | 1/1995 | Roser | 430/325 |

*Primary Examiner*—Janet C. Baxter
*Assistant Examiner*—Christopher G. Young
*Attorney, Agent, or Firm*—John P. Taylor

[57] ABSTRACT

Changing (varying, irregular) resist thickness on semiconductor wafers having irregular top surface topography or having different island sizes, affects the percent reflectance (and absorption efficiency) of incident photolithographic light, and consequently the critical dimensions of underlying features being formed (e.g., polysilicon gates). A low solvent content resist solution that can be applied as an aerosol provides a more uniform thickness resist film, eliminating or diminishing photoresist thickness variations. A top antireflective coating (TAR) also aids in uniformizing reflectance, despite resist thickness variations. The two techniques can be used alone, or together. Hence, better control over underlying gate size can be effected, without differential biasing.

3 Claims, 2 Drawing Sheets

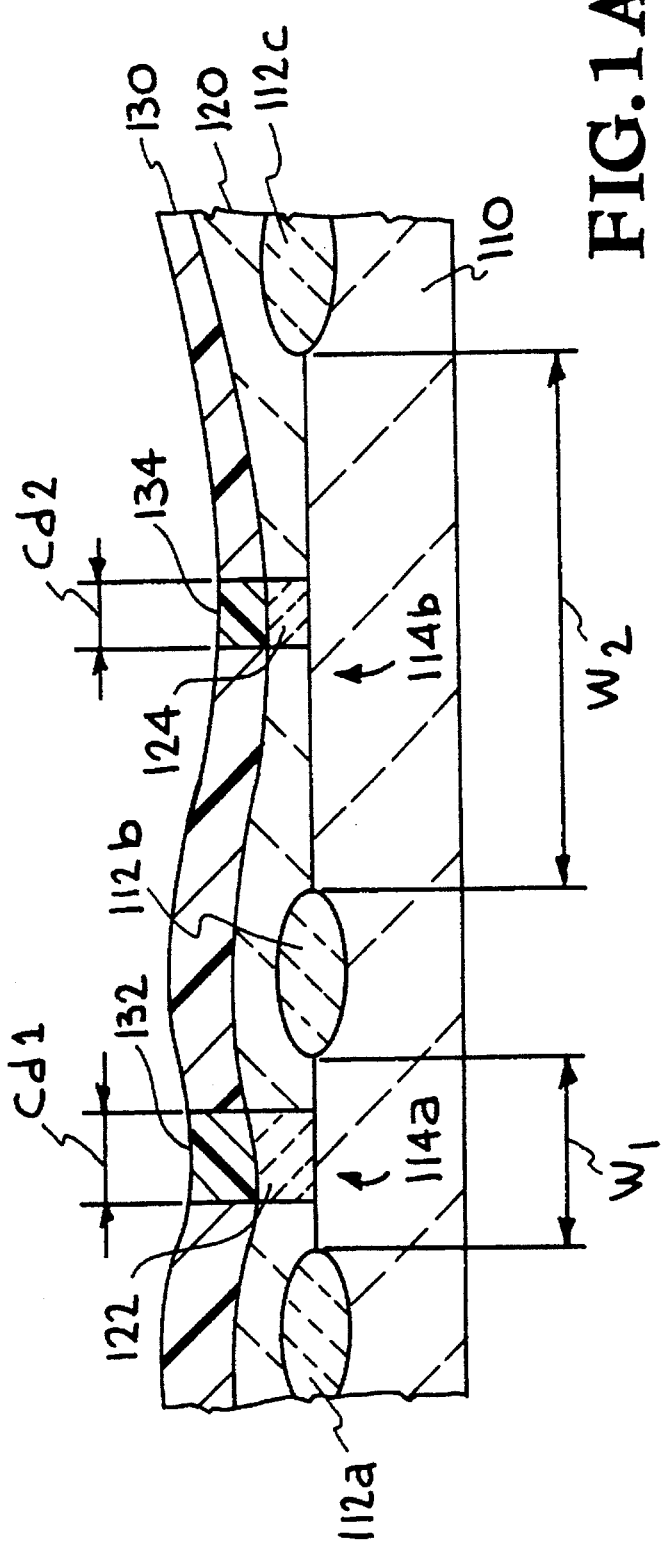
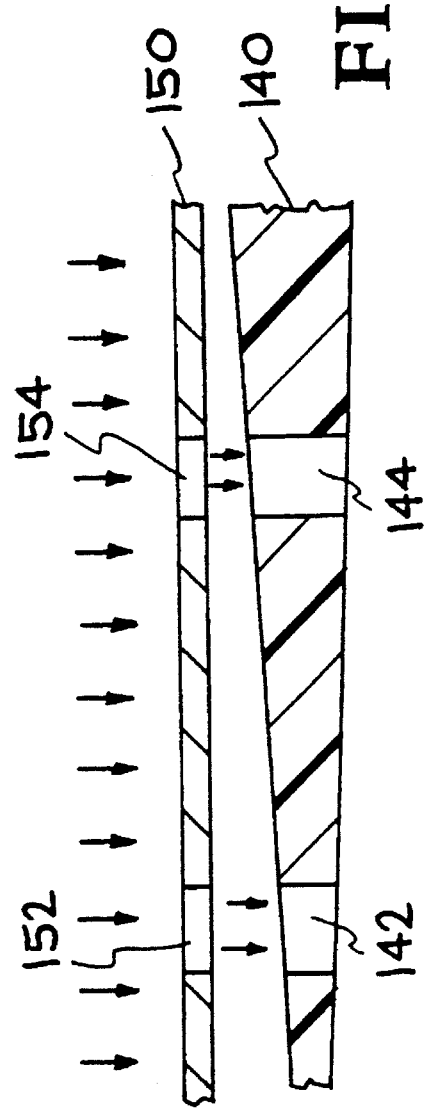
FIG.1A
FIG.1B

METHOD OF SELECTING AND APPLYING A TOP ANTIREFLECTIVE COATING OF A PARTIALLY FLUORINATED COMPOUND

CROSS-REFERENCE TO RELATED APPLICATIONS

This application is a division of application Ser. No. 08/189,574, filed Jan. 31, 1994, now allowed, as a division of Ser. No. 07/907,757, filed Jun. 29, 1992, now issued as U.S. Pat. No. 5,330,883 on Jul. 19, 1994.

TECHNICAL FIELD OF THE INVENTION

The invention relates to the fabrication of integrated circuit (IC) semiconductor devices, and more particularly to exercising control over the size of photolithographically-fabricated circuit elements, particularly polysilicon gates.

BACKGROUND OF THE INVENTION

Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

This is all good in theory, until one acknowledges that the uniformity of the illuminating light varies, typically at the source of the light, and that such non-uniformity will manifest itself in the size of features (e.g., photoresist lines) that can be created on the wafer. To the end of uniformizing the light incident on and passing through the mask, various techniques have been proposed, among these a technique discussed in commonly-owned U.S. Pat. No. 5,055,871 (Pasch).

The ultimate goal of uniformizing (homogenizing) the incident light is that the illumination uniformity (i.e., non-uniformity) of photolithographic apparatus will often set a limit to how small a feature, such as a line, can be imaged in a manufacturing environment. And, as a general principle, being able to create smaller integrated circuit features is better (faster, more compact, etc.).

Of no less concern than the ultimate size (smallness) of features, is the ability to control the critical dimension ("cd") from one feature to another. For example, since size generally equates with speed (e.g., smaller is generally faster), it is disadvantageous to have one polysilicon ("poly") gate turn out smaller (and faster) than another poly gate on the same device. Conversely, it is highly desirable to fabricate all similar features (e.g., poly gates) to be the same size (i.e., with the same "cd"), especially in gate-array type devices.

Among the causes for this concern over "cd" are problems in the thickness of films overlying an irregular topography on the wafer surface. Prior to the numerous steps involved in fabricating integrated circuit devices on a semiconductor wafer, the wafer is initially fairly flat - exhibiting a relatively regular topography.

However, prior structure formation often leaves the top surface topography of the silicon wafer highly irregular, with bumps, areas of unequal elevation, troughs, trenches and/or other surface irregularities. As a result of these irregularities, deposition of subsequent layers of materials could easily result in incomplete coverage, breaks in the deposited material, voids, etc., if it were deposited directly over the aforementioned highly irregular surfaces. If the irregularities are not alleviated at each major processing step, the top surface topography of the surface irregularities will tend to become even more irregular, causing further problems as layers stack up in further processing of the semiconductor structure.

As mentioned above, the application and patterning of photoresist is typically a key step in the fabrication of complex integrated circuit devices, and is a procedure that may be repeated at several different times throughout the fabrication process.

It has been noticed, and is generally known, that the thickness of a subsequently applied film, particularly photoresist, will vary (in a generally non-predictable manner) depending upon the irregular topography of the underlying surface. (Application of an overlying film to a flat, regular surface is generally not a problem.) For example, a photoresist layer, even if spun-on, will exhibit a different thickness, from point-to-point over the wafer (and within the area of a given device) depending on the irregular topography of underlying features.

This variation in the thickness of photoresist over an irregular topography is graphically illustrated in FIG. 1A.

FIG. 1A shows a portion of a semiconductor wafer 110 which has been processed to develop raised structures 112a, 112b and 112c of Field Oxide (FOX), between which are active areas (islands) 114a and 114b having a lower elevation (e.g., at wafer level). The island 114a between the FOX structures 112a and 112b has a width $w_1$ substantially smaller than the width $w_2$ of the island 114b between the FOX structures 112b and 112c. Having islands of different widths is not uncommon. For example, the island 114a is an "array island" having a width $w_1$ on the order of 3 microns, and the island 114b is "I/O (Input/Output) island" having a width $w_2$ on the order of hundreds of microns. Both types of islands are usually required for an integrated circuit device, and it is not uncommon to have widely varying island sizes in a single device. In any case, the island areas are usually lower (less elevated) than the field oxide areas.

An overlying layer 120 of polysilicon ("poly") is deposited over the wafer, which already exhibits an irregular topography. This is according to known techniques, and is presented herein by way of example only.

An overlying film 130 of photoresist is applied, in any suitable manner, over the poly layer 120, and photolithographically treated to create etch-resistant "lines" (photochemically-converted areas) 132 and 134 over the active areas 114a and 114b, respectively. The line features 132 and 14 are shown in reverse cross-hatch from the remainder of the film 130.

Ultimately, the photoresist layer 130 is etched (or washed) away, leaving only a pattern of photochemically-converted areas 132 and 134 overlying the poly 120. In subsequent fabrication steps, the wafer is etched (chemical, plasma, etc.), so that all but discrete poly regions 122 and 124 (shown in reverse cross-hatch) underlying respective photoresist features 132 and 134, respectively, are removed from the surface of the wafer. With additional processing, not shown, the poly regions 122 and 124 may perform as gates.

Since electron flow in the lateral direction (i.e., plane of the wafer) is of primary concern in the performance of circuit elements (e.g., poly gates), the transverse dimension of the poly gates 122 and 124 parallel to the plane of the wafer is of paramount interest. For purposes of this discussion, this transverse dimension is termed a "critical dimension", or cd. The poly gate 122 has a first cd, designated "cd1", and the poly gate 124 has a second cd, different from the first cd, designated "cd2".

In essence, the cd's of the two poly gates are different, because the width of the respective overlying photoresist features is different. (Generally, the width of a poly gate will be essentially the same as that of the overlying resist feature.)

As mentioned above, it is nearly impossible to apply a uniform layer of photoresist over an irregular surface. Hence, the thickness of the photoresist 130 over the active area 114a (particularly over the area where the poly gate 122 is to be formed) is different than the thickness of the photoresist 130 over the active area 114b (particularly where the poly gate 124 is to be formed).

It is also generally known, that the reflectance of a film (such as photoresist) will vary with its thickness. However, since the thickness of an overlying film at any given point on the surface of the semiconductor wafer (e.g., photoresist) is not readily determinable, the reflectance is consequently indeterminate.

This indeterminate nature of resist thickness and reflectivity over irregular underlying surfaces has important, negative ramifications in the semiconductor fabrication process, especially in the process of fabricating circuit elements having "critical dimensions".

FIG. 1B illustrates the reflectivity problem, and its manifestation in the size of a photoresist feature. Here, in a photolithographic process, a film 140 of photoresist is exposed to light (arrows ↓↓↓↓) of hypothetically uniform intensity. A mask 150 is interposed in the light path, and is provided with light-transmitting areas (lines) 152 and 154 allowing light (↓↓) to impinge upon selected areas 142 and 144, respectively, of the film 140.

In FIG. 1B, the thickness of the film 140 is intentionally shown to be different in the areas 142 and 144. And, as we will see, it is relatively insignificant that the film is thicker in the area 144 than in the area 142. And, we are ignoring, for purposes of this discussion, depth of field (depth of focus) issues that may arise from projecting a mask image onto a surface of varying height.

FIG. 1C illustrates graphically the effect of film thickness (horizontal axis) on reflectivity (i.e., the energy reflected by the film), and relates to the issues raised in FIG. 1B. While there is a general increase in reflectivity with increased thickness, there is a much more profound (generally sinusoidal) pattern of "maxima" 170a, 170b and 170c and "minima" 172a, 172b and 172c, which exhibits that the reflectivity for a given greater film thickness (point 172c) can well be less than the reflectivity for a given lesser film thickness (point 170b). (Dashed horizontal line 174 provided as a visual aid.) Importantly, these variations are dependent on relatively small, e.g., a quarter of a wavelength, variations in the thickness of the film—difficult dimensions to measure, let alone control.

Returning to FIG. 1B, it can be appreciated that it is rather indeterminate how much of the (supposedly uniform) incident energy (↓↓↓) will be absorbed by the photoresist film, and how much will be reflected, at any given point. And, as a general proposition, the more incident energy (↓↓↓) that is absorbed at a given point, the greater the area of the given feature 142 or 144 will "grow". Of course, the reverse would be true for reverse masking, wherein light acts outside of the desired feature, in which case the more light absorbed—the smaller the feature would be.

In any case, the point is made that an irregular thickness of an overlying film (e.g., photoresist) will impact upon the ultimate dimension of underlying features (e.g., poly gate) being formed, with commensurate undesirable functional effects.

Certainly, if reflectivity issues were ignored, which they cannot be, the widths of all of the photoresist lines and underlying features would be well-controlled. However, because the photoresist thickness varies from point-to-point over the wafer, and consequently its reflectivity varies from point-to-point, the efficiency of the incident light on the photoresist layer will vary commensurately, which will affect the ultimate width of the resist features.

Evidently, the efficiency of the photolithography process is dependent on the ability of the photoresist material to absorb the radiant energy (light), and this ability is, in turn, affected by the thickness/reflectance of the photoresist.

In the prior art, it has been known to compensate approximately for known variations (and to some extend, gross trends can be predicted) in photoresist thicknesses by "differentially biasing" the line widths in the high versus low reflectivity areas. And FIG. 1C illustrates that, to some extent, one can reasonably assume that the average reflectivity for an area with greater film thickness will reflect more than an area of lesser thickness. This concept may be employed with respect to relatively large Input/Output (I/O) versus relatively small active areas.

And, as mentioned before, in the prior art, it has also been known to use "spin-on" or other techniques in an attempt to apply a film (e.g., photoresist) having a relatively planar top surface. Of course, a relatively planar top surface is of little help in uniformizing the thickness of a film over an underlying surface having an irregular topography—in which case the thickness of the film would vary widely from point-to-point.

It has also been known to reduce the viscosity of the photoresist so that it goes on in a more planar manner. But, thickness will vary according to the topography of the underlying surface. Further, changing the photoresist chemistry (viscosity) can have adverse side effects, such as poor photolithography resolution.

In the prior art, it has also been known to perform subsequent steps to planarize the photoresist, which can be somewhat effective in overcoming the reflectance issues set forth above—again, so long as the photoresist is planarized over a relatively planar underlying surface.

Prior art techniques for accommodating "cd" variations due to photoresist thickness variations are relatively difficult and time consuming to implement, and may not deliver the desired results.

The following patents, incorporated by reference herein, are cited of general interest: U.S. Pat. Nos. 4,977,330; 4,929,992; 4,912,022; 4,906,852; 4,762,396; 4,698,128; 4,672,023; 4,665,007; 4,541,169; 4,506,434; and 4,402,128.

DISCLOSURE OF THE INVENTION

It is a general object of the present invention to provide improved photolithographic (or microlithographic) techniques for the fabrication of semiconductor devices.

It is therefore an object of the present invention to provide a technique for improving linewidth and cd (critical dimension) uniformity in photolithography (microlithography), without using spin-on techniques and without altering photoresist chemistry.

It is another object of the present invention to provide a technique for obtaining a uniform film thickness and reflectivity of photoresist and/or other masking chemicals, regardless of the topography of an underlying surface, particularly variations in the underlying active area size.

According to the invention, changing (varying, irregular) resist (photoresist film) thickness resulting from resist application to semiconductor wafers having irregular top surface topography or having different island sizes, affects the percent reflectance (and absorption efficiency) of incident photolithographic light, and consequently the critical dimensions of underlying features being formed (e.g., polysilicon gates).

According to one aspect of the invention, a novel low solvent content resist solution is formed, which can be applied (using suitable prior art application techniques) as an aerosol, to provide a more uniform thickness resist film, thereby eliminating or diminishing photoresist thickness variations.

According to another aspect of the invention, a novel top antireflective coating (TAR) is applied (using suitable prior art application techniques) over a regular or irregular thickness photoresist film. This aids in uniformizing reflectance, especially with regard to photoresist films having thickness variations.

The two techniques of applying a more uniform film of photoresist and applying a top antireflective coating can be used alone, or together. Hence, better control over underlying gate size can be effected, without differential biasing (differentially sizing photolithographic mask patterns to accommodate subsequent variations in underlying feature critical dimensions due to different size active areas, irregular top surface wafer topography, or the like).

Other objects, features and advantages of the invention will become apparent in light of the following description thereof.

BRIEF DESCRIPTION OF THE DRAWINGS

FIG. 1A is a generalized, cross-sectional view of a portion of a semiconductor device (or wafer), and illustrates an exemplary problem in the prior art, which problem is specifically addressed by the present invention.

FIG. 1B is a stylized cross-sectional view of a film of varying thickness, as first discussed with respect to FIG. 1A.

DETAILED DESCRIPTION OF THE INVENTION

Figure 1C:
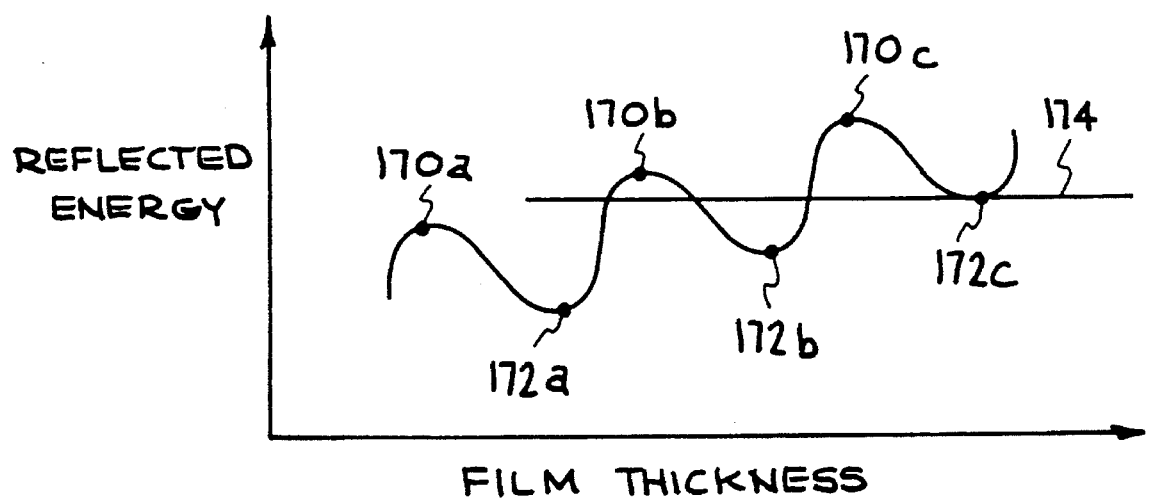
FIG. 1C is a generalized graph of reflectivity (reflected energy) versus film thickness, and relates to FIG. 1B.

FIGS. 1A–1C have been discussed above, and illustrate the impact that varying film thickness, and consequent varying film reflectivity, can have, especially in the photolithographic fabrication of polysilicon gates using a patterned photoresist layer (film).

As will become evident, the inventive techniques disclosed herein do not require a drawing for an understanding of the subject matter sought to be patented. 37 CFR §1.81(a)

According to the invention, the problem of varying film (e.g., photoresist) thickness exhibiting varying reflectivity is solved in one of two ways:

1. Deposit the photoresist with a uniform thickness; or

2. Minimize reflectance variations, by using an appropriate top anti-reflective (TAR) coating.

UNIFORM DEPOSITION OF PHOTORESIST

Evidently, if a layer of photoresist, or other suitable photoreactive material, could be applied with uniform thickness, irrespective of the underlying topography of the substrate, and especially in instances where the underlying topography is irregular, the resulting thickness of the photoresist film would be relatively uniform and would exhibit relatively uniform reflectivity. Hence, the critical dimension (cd) of underlying features being created with the photoresist would be more uniform.

As mentioned hereinbefore, one of the "best" known techniques for applying a film of photoresist is the "spin-on" technique, which strives to create a relatively flat (planar) top surface for the photoresist film. However, having a flat top surface is certainly no guarantee of having a uniform thickness over an irregular underlying topography. To the contrary, having a planar top surface photoresist film over an underlying irregular topography, however this may be achieved, is counter-indicative of having a uniform film thickness.

Other, non-related semiconductor fabrication processes teach that various semiconductor materials can be deposited in a more-or-less uniform layer (or film).

For example, chemical vapor deposition (CVD) of silicon nitride ("nitride") creates a "blanket" nitride layer which can cover an underlying irregular (non-planar) surface with surprising uniformity of thickness.

By way of further example, U.S. Pat. No. 5,075,257 (Hawk, et al.), incorporated by reference herein, discloses that silicon may be aerosolized and electrostatically deposited onto various grounded, high melting point substrates. Various preferred parameters are disclosed, relevant to aerosolizing silicon, including silicon powder size and purity, velocity, spacing (from substrate), electrostatic charge level, temperature and time (heat cycle). The references cited in the Hawk et al. patent, are primarily directed to: other techniques of applying silicon, especially molten silicon; vaporizing/condensing/re-vaporizing/recondensing solids, especially silicon; and electrodeposition. Each material and each process have their own vagaries and solutions.

According to the invention, a thicker, waxier photoresist solution is aerosolized and sprayed onto a semiconductor substrate, to form a film of photoresist on the substrate having uniform thickness, even over areas of the substrate exhibiting non-uniform (irregular) topographies. These areas may be areas of different height, or they may be areas of the same height but of different width surrounded by higher or lower features. Areas of the same height but having different widths are illustrated (114a, 114b) in FIG. 1A.

Photoresist is "normally" supplied and applied in a solution of approximately 90% (ninety percent) casting solvent, such as ethyl lactate and approximately 10% (ten percent) solids, such as novolac resin (diazoquinone). Such a solution having 90% solvent is entirely suitable for normal spin-on and other prior art techniques of applying photoresist to a substrate (wafer).

According to the invention, a photoresist solution has approximately 5% (five percent) casting solvent, and 95% (ninety-five percent) solids. These are the preferred ratios. The percent solvent is in the range of from 3% to 12%, and the percent solids is in the range of from 88% to 97%. The materials are, preferably, ethyl lactate for the casting solvent, and novolac resin (diazoquinone) for the dispersed solids.

According to the invention, the solution is created either by:

(a) simply dissolving a greater amount of solids (95% versus 10%) in the casting solution; or (b) preferably, starting with a "normal" solution (90% solvent) and evaporating the solvent out of the solution until the solution is approximately 5% solvent.

The thicker, gooier, waxier, low solvent content, photoresist solution provided by the present invention is amenable to aerosolizing, using prior art techniques for aerosolizing other materials. The viscosity of the low solvent content photoresist solution is on the order of 50–100 centipoise (cp). (Water has a cp of one.) Prior art, high solvent content, photoresist has a cp on the order of 1–10.

Heretofore, it has not been known or suggested to apply photoresist as an aerosol. Nor has it been known to provide photoresist in such a novel solution (very low solvent content) that would be amenable to such aerosol techniques. "Normal" (high solvent, very fluid) photoresist is simply not amenable to aerosol application techniques, nor would it appear that such has ever been contemplated.

However, the above-referenced Hawk, et al. Patent suggests that using "non-traditional" techniques ("traditional" being CVD, etc.) in semiconductor fabrication processes is gaining acceptance.

According to an alternate embodiment of the invention, photoresist is applied in powdered form, using a xerographic-type process. Namely:

(a) evaporating the solvent from photoresist solution until it solidifies;

(b) processing the resulting solid into powder form (using known powdering techniques);

(d) charging the powder; and (c) spraying the powdered photoresist normally (at ninety degrees) onto an electrostatically oppositely charged substrate.

TOP ANTI-REFLECTIVE (TAR) COATING

Evidently, if a layer of photoresist, or other suitable photoreactive material, having an irregular thickness, could be caused to exhibit uniform reflectivity, the resulting line widths formed therein by photolithography would be more uniform. Hence, the critical dimension (cd) of underlying features being created with the photoresist would be more uniform.

According to the invention, an antireflective film is applied to the irregular top surface of photoresist over an irregular underlying layer. Being on top of the photoresist, the antireflective film is termed a "top antireflective" (TAR) film.

Antireflective films, generally, have been known since Fabry/Perot, i.e., about one hundred years, for coating lenses (optics) and the like. Generally, an antireflective film has a refractive index less than that of the material it is coating, and has a thickness of L/4 (one quarter the wavelength "L" of the incident light in the underlying material). The wavelength "of choice" in photolithography is 365 nanometers (nm).

Preferably, according to Fabry/Perot, the refractive index "$n_{TAR}$" Of the antireflective coating would be the square root of the refractive index "$n_{PR}$".

Common photoresist solutions (i.e., the 90% solvent solutions described above) have a refractive index $n_{PR}$ of approximately 1.70, the square root of which is approximately 1.30. Hence, the ideal TAR would have a refractive index $n_{TAR}$ of 1.30. Water, having a refractive index of approximately 1.30, would make an ideal TAR, except that it would be difficult to work with in the semiconductor fabrication environment. Sugar also has a desirable refractive index, but would be expected to crystallize (not desired) on top of photoresist.

International Business Machines (IBM), on the other hand, is known to use a TAR in semiconductor fabrication having a refractive index of approximately 1.42, which is relatively far removed from the "ideal" of 1.30.

According to the present invention, a top antireflective coating is applied over photoresist, and uniformizes reflectivity of a photoresist film having varying thickness.

The advantageous attributes of the inventive TAR would be that it is easy to apply (according to known techniques) to a photoresist-coated semiconductor wafer, adheres well thereto, and that it has a refractive index very close to "ideal" (1.30). The inventor has discovered a group of compounds satisfying these criteria. This group of compounds, one in particular, has a refractive index relatively extremely close to the ideal, namely "$n_{TAR}$"=1.34.

The group of compounds discovered to be nearly ideal for use as a TAR over photoresist is "partially polyfluorinated compounds" While fully (versus partially) fluorinated compounds exhibit relatively low (approaching 1.30) refractive indexes, they do not adhere well to photoresist. Partially fluorinated compounds, on the other hand, exhibit not only advantageous (close to 1.30) refractive indexes, but also have been found to adhere well to photoresist.

A preferred partially fluorinated compound for use as a top antireflective coating over photoresist is:

$$R_f\!=\!F(CF_2CF_2)_{3-8}$$

$$(R_fCH_2CH_2O)P(O)(ONH_4)_2$$

This compound has been shown to exhibit the desired qualities, including a refractive index of 1.34, which is on the order of 50% better than IBM's TAR having a refractive index of 1.42.

An entire group of partially fluorinated compounds having low refractive index and easily applied and adhered to photoresist are shown on the following TABLE VI, from Dow Chemical Corporation:

TABLE VI

| Chemical Structures | |
|---|---|
| $R_f = F(CF_2CF_2)_{3-8}$ | |
| FSA | $R_fCH_2CH_2SCH_2CH_2CO_2Li$ |
| FSP, FSE | $(R_fCH_2CH_2O)P(O)(ONH_4)_2$ $(R_fCH_2CH_2O)_2P(O)(ONH_4)$ |
| UR | $(R_fCH_2CH_2O)P(O)(OH)_2$ $(R_fCH_2CH_2O)_2P(O)(OH)$ |
| FSN | $R_fCH_2CH_2O(CH_2CH_2O)_xH$ |
| FSN-100 | $R_fCH_2CH_2O(CH_2CH_2O)_xH$ |
| FSO | $R_fCH_2CH_2O(CH_2CH_2O)_yH$ |
| FSO-100 | $R_fCH_2CH_2O(CH_2CH_2O)_yH$ |
| FSC | $R_fCH_2CH_2SCH_2CH_2N^+(CH_3)_3$ $CH_3SO_4^-$ |
| FSK | $R_fCH_2CH(OCOCH_3)CH_2N^+(CH_3)_2CH_2CO_2^-$ |
| TBS | $R_fCH_2CH_2SO_3X$ (X = H and $NH_4$) |

The "group" of partially fluorinated compounds shown in the TABLE above, fall into the class of compounds called "surfactants". As a general proposition, surfactants are generally employed in soap solutions and the like. Their usefulness as a TAR over photoresist displays unexpected results (for compounds intended to be used as surfactants). The compounds can be applied in any suitable manner over the photosensitive material (e.g., photoresist), for example by spraying the compounds onto the photoresist-coated wafer.

As discussed above, partially fluorinated compounds are suitable for top anti-reflective coatings over photoresist. Two issues are paramount—the refractive index, and the ability to adhere to photoresist. Generally, the less fluorinated the compound, the higher its refractive index and the better its adhesion. Hence, a balance must be struck between these two criteria.

The present invention is primarily directed to thin films of photoresist, for example 1–2 μm thick. Applicability to other photomasking materials is indicated.

By applying the resist with more uniform thickness (aerosol or powder), or by providing a top antireflective (TAR) coating, or by performing both techniques, reflectivity is uniformized (and with TAR, is minimized), absorption of incident photolithographic light is uniformized (and increased, with TAR), and better control over feature size, from feature to feature is effected. This provides effective control over the cd of features, especially features in different topographical areas (e.g., active areas versus I/O areas), and eliminates the need for differential biasing (differentially sizing the mask patterns for the various features so that they turn out the same size in the wafer, regardless of active area size). Differential biasing adds a level of complexity to design rules, which can be avoided according to the present invention.

ALTERNATE EMBODIMENT

It has been discussed, above, how photoresist can be applied in aerosol form to provide a conformal layer over topological (irregular) wafers. It has also been discussed how non-conformal layers of photoresist create problems in subsequent fabrication steps (e.g., photolithography), such as due to reflectance non-uniformities.

It has also been discussed how a top anti-reflective coating of partially fluorinated compound can be applied over photoresist.

In either case (photoresist, TAR), aerosol methods may be employed.

According to this embodiment of the invention, a coating (e.g., photoresist, TAR) is applied to a semiconductor wafer by dipping the wafer in a reservoir containing the material to be applied, and then "pulling" the wafer out of the reservoir.

Figure 2:
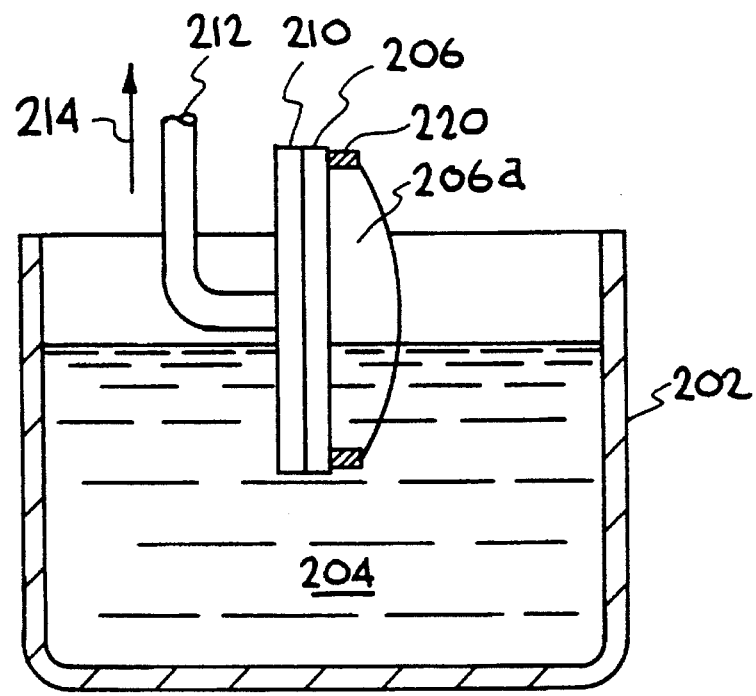
FIG. 2 is a cross-sectional, partially-perspective view of an alternate embodiment of the invention.

FIG. 2 shows a reservoir 202 containing a supply of material 204 to be applied as a conformal layer over a semiconductor wafer. In this example, the material 204 is a high solvent content (e.g., "off the shelf") photoresist solution.

The wafer 206 has a front surface 206a containing circuit elements (not shown). The opposite, back surface of the wafer is mounted to plate 210, and held firmly against the plate by means of a vacuum supplied over a line 212. The line 212 is suitable as a mechanical support for the plate, having an orifice therethrough.

To coat the wafer, the wafer is completely immersed, edgewise, into the photoresist supply in the reservoir. Then, it is pulled slowly out of the photoresist, as indicated by the arrow (↑) 214. As the wafer is pulled out of the photoresist, the photoresist will adhere to the front surface of the wafer, as a thin film. Excess photoresist will tend to run off the face of the wafer, due to gravity, returning to the supply of photoresist in the reservoir. The photoresist will dry (solvent evaporates) on the exposed-to-air portion of the wafer (i.e., the part that has already been pulled out of the photoresist). By controlling the speed at which the wafer is pulled out of the photoresist supply, the thickness of the ultimate photoresist coating over the surface of the wafer can be controlled.

The plate 210, or "wafer holder" must evidently be inert with respect to the material contained in the reservoir. It must also seal the back surface of the wafer from having photoresist deposited thereon. A suitable material for the wafer holder is Teflon. Evidently, photoresist will tend to adhere to the wafer holder as it is pulled out of the reservoir. Therefore, the wafer holder is advantageously formed of a material to which the photoresist is less adhesive than with regard to the wafer.

In the case that it is also desirable to exclude photoresist from a narrow zone around the peripheral edge of the wafer, an "exclusion band" 220 is suitably disposed on the front surface of the wafer, as shown. This band may simply be a rubber ring sealing against the front surface of the wafer in the peripheral zone.

What is claimed is:

1. A method of selecting and applying a top antireflective coating over a film of photoresist during semiconductor fabrication, comprising:

a) selecting a coating of a partially fluorinated compound capable of adhering well to photoresist, said partially fluorinated compound selected from the group consisting of:
   (1) $R_fCH_2CH_2SCH_2CH_2CO_2Li$;
   (2) $(R_fCH_2CH_2O)P(O)(ONH_4)_2$;
   (3) $(R_fCH_2CH_2O)_2P(O)(ONH_4)$;
   (4) $R_fCH_2CH_2O)P(O)(OH)_2$;
   (5) $(R_fCH_2CH_2O)_2P(O)(OH)$;
   (6) $R_fCH_2CH_2SCH_2CH_2N^+(CH_3)_3CH_3SO_4^-$;
   (7) $R_fCH_2CH(OCOCH_3)CH_2N^{+(CH}{}_3)_2CH_2CO_2^-$; and
   (8) $R_fCH_2CH_2SO_3X$ (X=H or $NH_4$);
   wherein $R_f=F(CF_2CF_2)_m$ and m=3–8; and b) applying the coating over the photoresist to a thickness of L/4, where "L" is the wavelength of incident photolithographic light in the photoresist.

2. A method of selecting and applying a top antireflective coating over a film of photoresist during semiconductor fabrication, comprising:

a) selecting a coating of a partially fluorinated compound having a refractive index of within a range of from about 1.30 to about 1.34 and capable of adhering well to photoresist, said partially fluorinated compound selected from the group consisting of:
   (1) $R_fCH_2CH_2SCH_2CH_2CO_2Li$;
   (2) $(R_fCH_2CH_2O)P(O)(ONH_4)_2$;
   (3) $(R_fCH_2CH_2O)_2P(O)(ONH_4)$;
   (4) $(R_fCH_2CH_2O)P(O)(OH)_2$;
   (5) $(R_fCH_2CH_2O)_2P(O)(OH)$;
   (6) $R_fCH_2CH_2SCH_2CH_2N^+(CH_3)_3CH_3SO_4^-$;
   (7) $R_fCH_2CH(OCOCH_3)CH_2N^+(CH_3)_2CH_2CO_2^-$; and
   (8) $R_fCH_2CH_2SO_3X$ (X=H or $NH_4$);
   wherein $R_f=F(CF_2CF_2)_m$ and m=3–8; and b) applying the coating over the photoresist to a thickness of L/4, where "L" is the wavelength of incident photolithographic light in the photoresist.

3. A method of selecting and applying a top antireflective coating over a film of photoresist during semiconductor fabrication, comprising:

a) selecting a coating of a partially fluorinated compound having a refractive index of about 1.34 and capable of adhering well to photoresist, said partially fluorinated compound selected from the group consisting of:

(1) $R_fCH_2CH_2SCH_2CH_2CO_2Li$;
(2) $(R_fCH_2CH_2O)P(O)(ONH_4)_2$;
(3) $(R_fCH_2CH_2O)_2P(O)(ONH_4)_2$;
(4) $(R_fCH_2CH_2O)P(O)(OH)_2$;
(5) $(R_fCH_2CH_2O)_2P(O)(OH)$;
(6) $R_fCH_2CH_2SCH_2CH_2N^+(CH_3)_3\ CH_3SO_4^-$;
(7) $R_fCH_2CH(OCOCH_3)CH_2N^+(CH_3)_2CH_2CO_2^-$; and
(8) $R_fCH_2CH_2SO_3X$ (X=H or $NH_4$);

wherein $R_f=F(CF_2CF_2)_m$ and m=3–8; and b) applying the coating over the photoresist to a thickness of L/4, where "L" is the wavelength of incident photolithographic light in the photoresist.

* * * * *

UNITED STATES PATENT AND TRADEMARK OFFICE
CERTIFICATE OF CORRECTION

PATENT NO. : 5,595,861  
DATED : January 21, 1997  
INVENTOR(S) : Mario Garza

Page 1 of 2

It is certified that error appears in the above-indentified patent and that said Letters Patent is hereby corrected as shown below:

Col. 10, line 34, claim 1,
change "(6) $R_fCH_2CH_2SCH_2CH_2N^+(CH_3)_3CH_3SO_4^-$;"
to "(6) $R_fCH_2CH_2SCH_2CH_2N^+(CH_3)_3 \; CH_3SO_4^-$;".

Col. 10, line 35, claim 1,
change "(7) $R_fCH_2CH(OCOCH_3)CH_2N^{+(CH_3)_2}CH_2CO_2^-$; and"
to "(7) $R_fCH_2CH(OCOCH_3)CH_2N^+ \; (CH_3)_2CH_2CO_2^-$; and".

Col. 10, line 54, claim 2,
change "(6) $R_fCH_2CH_2SCH_2CH_2N^+(CH_3)_3CH_3SO_4^-$;"
to "(6) $R_fCH_2CH_2SCH_2CH_2N^+(CH_3)_3 \; CH_3SO_4^-$;".

Col. 10, line 55, claim 2,
change "(7) $R_fCH_2CH(OCOCH_3)CH_2N^+(CH_3)_2CH_2CO_2^-$; and"
to "(7) $R_fCH_2CH(OCOCH_3)CH_2N^+ \; (CH_3)_2CH_2CO_2^-$; and".

UNITED STATES PATENT AND TRADEMARK OFFICE
CERTIFICATE OF CORRECTION

PATENT NO. : 5,595,861
DATED : January 21, 1997
INVENTOR(S) : Mario Garza

It is certified that error appears in the above-indentified patent and that said Letters Patent is hereby corrected as shown below:

Col. 11, line 3, claim 3,
   change "(3) $(R_fCH_2CH_2O)_2P(O)(ONH_4)_2;$"
   to "(3) $(R_fCH_2CH_2O)_2P(O)(ONH_4);$".

Col. 11, line 7, claim 3,
   change "(7) $R_fCH_2CH(OCOCH_3)CH_2N^+(CH_3)_2CH_2CO_2^-;$ and"
   to "(7) $R_fCH_2CH(OCOCH_3)CH_2N^+(CH_3)_2CH_2CO_2^-;$ and".

Signed and Sealed this

Fifteenth Day of April, 1997

Attest:

BRUCE LEHMAN

*Attesting Officer*     *Commissioner of Patents and Trademarks*